(12) United States Patent
Shih et al.

(10) Patent No.: US 6,886,696 B2
(45) Date of Patent: May 3, 2005

(54) WAFER CONTAINER WITH REMOVABLE SIDEWALLS

(75) Inventors: Shin-Chi Shih, Taichung (TW); Tzu-Yen Lin, Jubei (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 98 days.

(21) Appl. No.: 10/346,049

(22) Filed: Jan. 15, 2003

(65) Prior Publication Data

US 2004/0134829 A1 Jul. 15, 2004

(51) Int. Cl.[7] .............................................. B65D 85/30
(52) U.S. Cl. ...................................................... 206/710
(58) Field of Search ................................. 206/303, 445, 206/454, 455, 499, 710, 722, 723

(56) References Cited

U.S. PATENT DOCUMENTS

| | | | | |
|---|---|---|---|---|
| 4,787,508 A | * | 11/1988 | Wu et al. .................. | 206/445 |
| 5,366,079 A | * | 11/1994 | Lin et al. .................. | 206/710 |
| 5,454,468 A | * | 10/1995 | Chou et al. ................ | 206/303 |
| 5,551,571 A | * | 9/1996 | Lin et al. .................. | 206/710 |
| 5,611,448 A | * | 3/1997 | Chen ....................... | 220/4.27 |
| 5,699,916 A | * | 12/1997 | Liang ...................... | 206/710 |
| 5,788,082 A | * | 8/1998 | Nyseth ..................... | 206/711 |
| 6,533,123 B1 | * | 3/2003 | Nakamura et al. .......... | 206/710 |

\* cited by examiner

Primary Examiner—John A. Ricci
(74) Attorney, Agent, or Firm—Tung & Associates

(57) ABSTRACT

A wafer container suitable for the storage and/or transport of multiple IC wafers. The container includes a wafer holder provided with multiple, upward-standing sidewalls, at least one of which is removable to enable horizontal as well as vertical removal of the IC wafers from the wafer holder and prevent collisions which may otherwise occur between the wafer being removed and the sidewalls. The inner, wafer-engaging surface of each of the sidewalls may include a flexible material or pad for preventing scratching and/or chipping of the wafers during wafer storage, transport and/or removal.

16 Claims, 2 Drawing Sheets

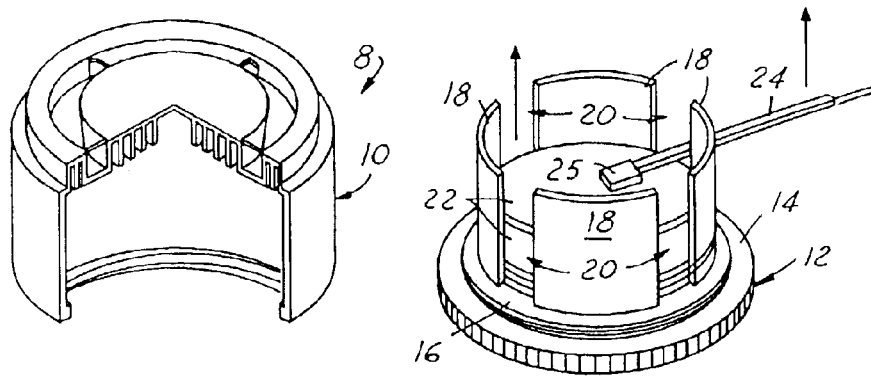
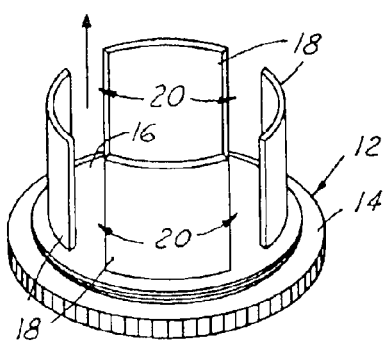
(conventional art)
FIG. 2
(conventional art)
FIG. 1
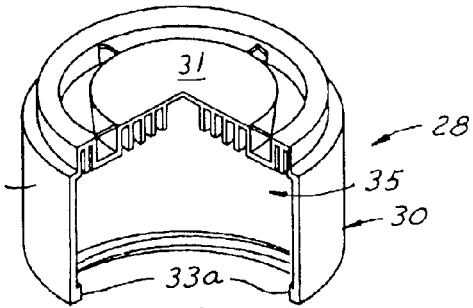
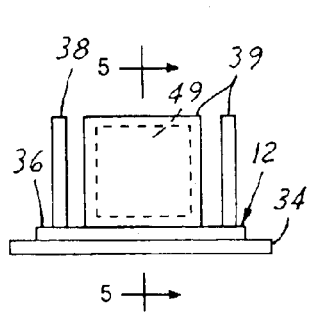
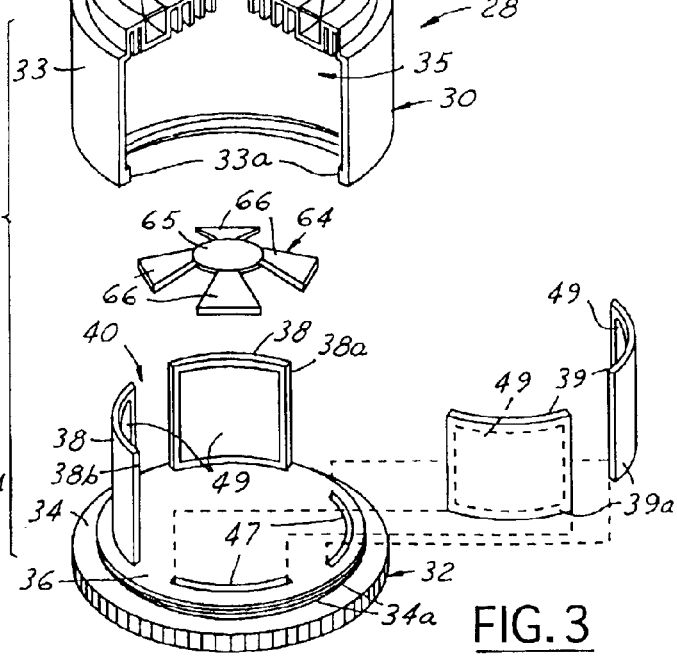
FIG. 4
FIG. 3

WAFER CONTAINER WITH REMOVABLE SIDEWALLS

FIELD OF THE INVENTION

The present invention relates to containers used in the packaging of semiconductor wafers for transport or shipping. More particularly, the present invention relates to a new and improved wafer container having a removable sidewall or sidewalls which facilitate(s) horizontal removal of wafers from the container to prevent damage to the wafers.

BACKGROUND OF THE INVENTION

In the semiconductor production industry, various processing steps are used to fabricate integrated circuits on a semiconductor wafer. These steps include the deposition of layers of different materials including metallization layers, passivation layers and insulation layers on the wafer substrate, as well as photoresist stripping and sidewall passivation polymer layer removal. In modern memory devices, for example, multiple layers of metal conductors are required for providing a multi-layer metal interconnection structure in defining a circuit on the wafer. Chemical vapor deposition (CVD) processes are widely used to form layers of materials on a semiconductor wafer. Other processing steps in the fabrication of the circuits include formation of a photoresist or other mask such as titanium oxide or silicon oxide, in the form of the desired metal interconnection pattern, using standard lithographic techniques; subjecting the wafer substrate to a dry etching process to remove the conducting layer from the areas not covered by the mask, thereby leaving the metal layer in the form of the masked pattern; removing the mask layer using reactive plasma and chlorine gas, thereby exposing the top surface of the metal interconnect layer; cooling and drying the wafer substrate by applying water and nitrogen gas to the wafer substrate; and removing or stripping polymer residues from the wafer substrate.

After the devices are fabricated on the wafer surface, the wafers are packaged and transported to a separate facility which is remote from the fabrication facility for separation of the wafers into individual chips. The integrated circuits on the wafer are prone to damage due to mechanical shock during transit from the fabrication facility to the packaging or other facility. In addition to mechanical shock, integrated circuits are susceptible to damage by electrostatic discharges (ESD) and electrical overstress (EOS). As USLI technology continues downscaling of device features, the wafer size becomes correspondingly larger for economical production of the integrated circuits. Accordingly, the wafers become increasingly expensive with increased size. For example, the cost of a 12" wafer is about 2.5 times the cost of an 8" wafer. One production lot (25 wafers) of 8" wafers costs about $40,000. Thus, protection of the wafers during shipping is of utmost importance. Clearly, suppliers of semiconductor wafers would, if possible, like to avoid or reduce as much as possible the potential wafer damage, inconvenience and quality control issues which are associated with traditional methods of packaging wafers for transport.

Transport and storage of semiconductor wafers has presented problems as the diameter of wafers has increased in size and the circuitry on the wafers has become increasingly miniaturized. Containers for storing and transporting IC wafers are described in U.S. Pat. Nos. 4,787,508 and 5,366,079. While the disclosed containers are major improvements over other known containers, in certain situations, damage can still occur. The large-diameter wafers (8 or 12 inches in diameter) are the most vulnerable to damage. Any movement of or stress on the wafers in the container could potentially damage the very fragile circuit patterns on the surface of the wafers and/or crack the wafers.

U.S. Pat. No. 5,366,079 discloses a container and retainer combination that effectively reduces damage due to shifting of the wafers in the container. However, the storage and handling of very large diameter wafers still presents problems due to the flexing of the large diameter containers when they are opened and otherwise manipulated, resulting in fractured and broken wafers.

A typical conventional IC (integrated circuit) wafer container, such as that disclosed in U.S. Pat. No. 5,699,916, is shown in FIGS. 1 and 2. The wafer container 8 includes a wafer holder 12 including a base 14 with a stepped wafer support surface 16 thereon. Multiple, curved or arcuate wafer panels 18 extend upwardly from the wafer support surface 16, defining a vertical slot 20 between adjacent wafer panels 18. As shown in FIG. 2, multiple semiconductor wafers 22 are stacked on the wafer support surface 16 and on each other. An enclosure 10 fits over the upward-standing wafer panels 18 and the wafer support surface 16 and engages the base 14 to enclose the stacked wafers 22.

Removal or unpacking of the individual wafers 22 from the wafer holder 12 is effected by extending an elongated vacuum pin 24, terminated by a vacuum head 25, through one of the slots 20 and then applying the vacuum head 25 to the upper surface of the uppermost wafer 22 such that vacuum pressure holds the wafer 22 against the vacuum head 25. Next, the vacuum pin 24 and attached wafer 22 are lifted, as indicated by the arrows, until the wafer 22 being removed clears the height of the wafer panels 18. The wafer 22 is then moved horizontally over the wafer panels 18 and placed in a separate location.

One of the problems commonly encountered during unpacking of the wafers 22 from the wafer holder 12 is that the delicate wafers 22, horizontal movement of which is constrained by the fixed wafer panels 18, may be damaged in the event that the wafers 22 inadvertently collide with the wafer panels 18 during removal. For that reason, much care must be taken to minimize horizontal movement of the vacuum pin 24 and the wafer 22 being removed to prevent collision of the wafer 22 with the wafer panels 18. Consequently, unloading of all of the wafers 22 from the wafer holder 12 may require an inordinately long period of time, reducing the operational efficiency of the unpacking procedure. Accordingly, a wafer container is needed which facilitates removal or unpacking of wafers in an efficient and safe manner.

An object of the present invention is to provide a new and improved wafer container suitable for IC (integrated circuit) wafers.

Another object of the present invention is to provide a new and improved wafer container suitable for storing and/or transporting IC wafers, which container facilitates the efficient and safe removal of IC wafers from the container.

Still another object of the present invention is to provide a new and improved wafer container which enables horizontal as well as vertical removal of IC wafers from the container.

Yet another object of the present invention is to provide a new and improved wafer container which prevents cracking, chipping or other damage to IC wafers as the wafers are unpacked or removed from the container.

A still further object of the present invention is to provide a new and improved wafer container which includes a wafer holder having multiple, upward-standing sidewalls, at least one of which may be removed to enable horizontal removal of IC wafers from the container.

Yet another object of the present invention is to provide a new and improved wafer container including a wafer holder having multiple, upward-standing sidewalls, the inner surface of which sidewalls may be fitted or coated with a soft flexible material or pad to prevent scratching of the wafers during wafer storage, transport and/or removal.

SUMMARY OF THE INVENTION

In accordance with these and other objects and advantages, the present invention is generally directed to a wafer container suitable for the storage and/or transport of multiple IC wafers. The container includes a wafer holder provided with multiple, upward-standing sidewalls, at least one of which is removable to enable horizontal as well as vertical removal of the IC wafers from the wafer holder and prevent collisions which may otherwise occur between the wafer being removed and the sidewalls. The inner, wafer-engaging surface of each of the sidewalls may include a flexible material or pad for preventing scratching and/or chipping of the wafers during wafer storage, transport and/or removal.

BRIEF DESCRIPTION OF THE DRAWINGS

The invention will better understood, by way of example, with reference to the accompanying drawings, in which:

FIG. 1 is a perspective view, partially in section, of a typical conventional IC wafer container;

FIG. 2 is a perspective view of a wafer holder portion of a conventional IC wafer container;

FIG. 3 is an exploded, perspective view, partially in section, of an IC wafer container with removable sidewalls of the present invention;

FIG. 4 is a front view of the IC wafer container of the present invention;

DESCRIPTION OF THE PREFERRED EMBODIMENTS

The present invention has particularly beneficial utility in the storage, transport, and/or shipping of multiple IC semiconductor wafers and facilitating safe and efficient removal or unpacking of the wafers. However, the invention is not so limited in application, and while references may be made to such IC wafers, the present invention is more generally applicable to storing, transporting and/or shipping delicate items or substrates and facilitating safe and efficient removal or unpacking of the items or substrates after storage, transportation and/or shipping.

Figure 5:
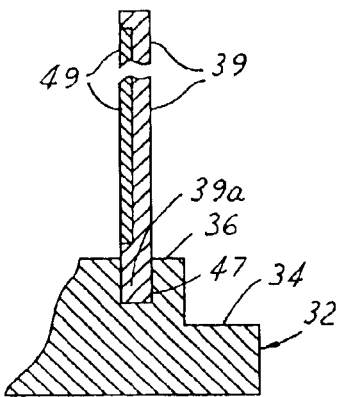
FIG. 5 is a sectional view, taken along section lines 5—5 in FIG. 4.
Figure 6:
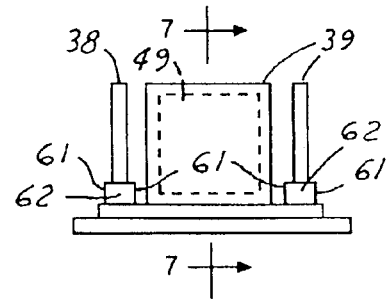
FIG. 6 is a front view of another embodiment of the IC wafer container of the present invention.

Referring initially to FIGS. 3–7, an illustrative embodiment of the IC wafer container of the present invention is generally indicated by reference numeral 28. Preferably, through not necessarily, the components of the IC wafer container 28 hereinafter described are constructed of a clear or translucent material. The IC wafer container 28 includes a wafer holder 32, on which is removably fitted an enclosure 30 having an enclosure top 31 from which downwardly extends a cylindrical enclosure wall 33 that defines an enclosure interior 35. An annular flange 33a may be shaped in the interior surface of the enclosure wall 33 at the bottom end thereof. The wafer holder 32 includes a typically circular base 34 from which extends a stepped wafer support surface 36. The wafer support surface 36 may be provided with a circumferential base groove 34a which removably receives the flange 33a of the enclosure wall 33 in a snap-fit, as hereinafter further described. A pair of fixed sidewalls 38, each typically having a generally arcuate or curved cross-section, extends upwardly from the wafer support surface 36 and is fixedly attached to the wafer support surface 36. The typically concave inside surface of each fixed sidewall 38 may be provided with a flexible cushion or pad 49 which may be constructed of foam or other soft, pliant material, the purpose of which cushion or pad 49 will be hereinafter described. As shown in FIG. 3, in one embodiment at least one, and typically, a pair of sidewall grooves 47, each matching the contour of each of the removable sidewalls 39, is provided in the wafer support surface 36 in opposing relationship to the fixed sidewalls 38. At least one, and typically, a pair of removable sidewalls 39 is removably attached to the wafer support surface 36 typically by friction-fitting the lower end portion 39a of each removable sidewall 39 in the corresponding sidewall groove 47, as shown in FIGS. 3 and 5. In another embodiment of the invention, shown in FIGS. 6 and 7, a pair of parallel, typically arcuate sidewall flanges 61, which may be connected at each end by a flange connector 62, extends upwardly from the wafer support surface 36 in place of the sidewall grooves 47 heretofore described with respect to FIG. 3. Accordingly, the bottom end portion 39a of each removable sidewall 39 is removably friction-fitted between the corresponding pair of sidewall flanges 61 to removably mount the removable sidewalls 39 on the wafer support surface 36. Like that of the fixed sidewalls 38, the typically concave interior face of each removable sidewall 39 may be provided with a flexible cushion or pad 49 which may be constructed of foam or other soft, pliant material. A sidewall space 40 is defined between adjacent ones of the fixed sidewalls 38 and the removable sidewalls 39.

Figure 8:
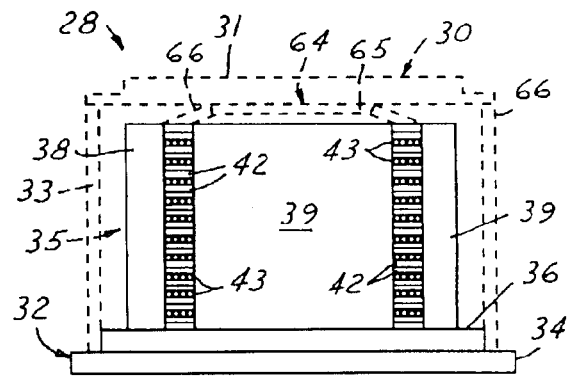
FIG. 8 is a front view of the IC wafer container of the present invention, loaded with IC wafers, with the enclosure portion of the container shown in phantom.

Referring again to FIG. 3 and to FIG. 8, the IC wafer container 28 is a suitable vehicle for the storage, transport and/or shipping of multiple IC wafers 42. Accordingly, the IC wafers 42 are stacked on top of each other on the wafer support surface 36 inside the upward-standing fixed sidewalls 38 and removable sidewalls 39, as shown in FIG. 8. A sheet of lint-free paper 43 may be interposed between every two of the stacked IC wafers 42. It will be appreciated by those skilled in the art that the pads 49 on the interior concave surfaces of the fixed sidewalls 38 and removable sidewalls 39, respectively, prevent scratching or other damage to the IC wafers 42 as the edges of the IC wafers 42 inadvertently contact the pads 49 during loading or transport of the IC wafers 42. After the IC wafers 42 are loaded in stacked form into the wafer holder 32, a wafer spring or retainer 64, constructed of a flexible, resilient material and having a central portion 65 from which outwardly extends multiple retainer arms 66, is placed on the upper one of the stacked IC wafers 42 or on a sheet of paper 43 placed on the uppermost one of the IC wafers 42. Finally, the enclosure 30 is lowered in place over the wafer holder 32 until the flange 33a on the lower interior of the enclosure wall 33 removably snaps into the circumferential base groove 34a of the base 34. Accordingly, the wafer retainer 64 is interposed between the bottom, interior surface of the enclosure top 31 and the upper one of the IC wafers 42 and functions as a shock-absorbing spring during handling and transport of the IC wafer container 28 during storage, transport and/or shipping of the IC wafers 42 contained therein.

Figure 7:
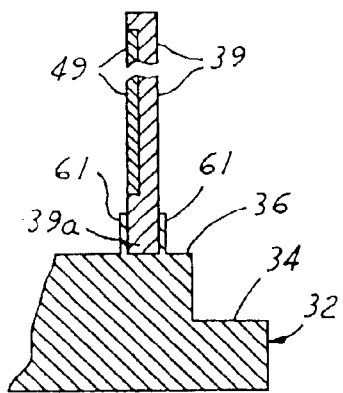
FIG. 7 is a sectional view, taken along section lines 7—7 in FIG. 6.
Figure 10:
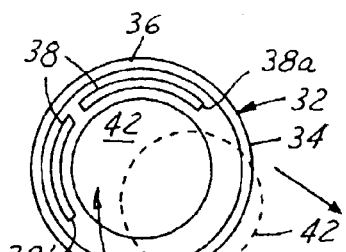
FIG. 10 is a top view of the IC wafer container, illustrating removal of wafers from the container in implementation of the present invention.
Figure 9:
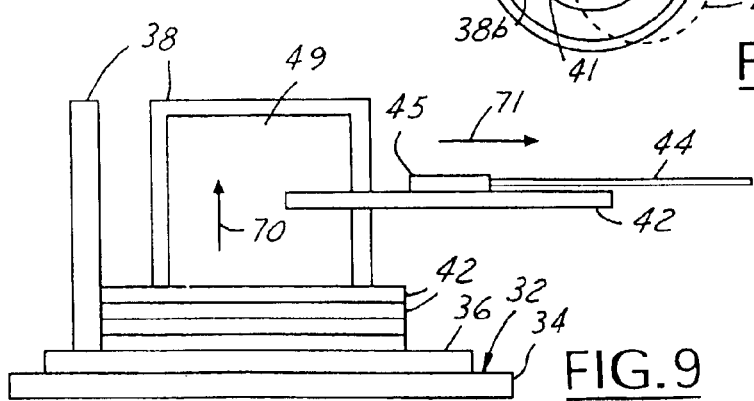
FIG. 9 is a front view of the IC wafer container of the present invention, more particularly illustrating removal of wafers from the container in implementation of the present invention.

Referring next to FIGS. 9 and 10, the multiple wafers 42 are removed from the IC wafer container 28 as follows. First, the enclosure 30 is raised from the wafer holder 32 after the flange 33a (FIG. 3) is disengaged from the base groove 34a of the wafer holder 32. Next, the removable sidewalls 39 are removed from the wafer support surface 36 by disengaging the lower end 39a of each removable sidewall 39 from the corresponding sidewall groove 47 (FIG. 5) or from the corresponding pair of adjacent sidewall flanges 61 (FIG. 7). The uppermost IC wafer 42 is then removed from the wafer holder 32 by applying the vacuum head 45 of a vacuum pin 44 to the upper surface of the uppermost IC wafer 42 in the manner shown in FIG. 9. Accordingly, the IC wafer 42 adheres to the bottom surface of the vacuum head 45 by vacuum suction pressure in such a manner that the IC wafer 42 can be lifted from the underlying IC wafer 45 by lifting upwardly on the vacuum pin 44. As shown in FIG. 10, in a preferred embodiment a wafer removal opening 41 is defined between a wall end 38a of one of the fixed sidewalls 38 and the wall end 38b of the adjacent fixed sidewall 38. The straight-line width of the wafer removal opening 41 is greater than the diameter of each IC wafer 42. Accordingly, it will be appreciated from a consideration of FIG. 9 that each IC wafer 42 can be moved in both the horizontal direction 71 as well as the vertical direction 70, through the wafer removal opening 41, during removal of the IC wafer 42 from the wafer holder 32, without causing the IC wafer 42 to inadvertently strike one of the remaining upward-standing fixed sidewalls 38. After the uppermost IC wafer 42 is removed from the wafer holder 32 in the foregoing manner, the remaining underlying IC wafers 42 are removed from the wafer holder 32 in like manner. Finally, the removable sidewalls 39 are replaced on the wafer holder 32 preparatory to loading a second lot of the IC wafers 42 therein for storage, transport and/or shipping as heretofore described.

While the preferred embodiment of the invention heretofore described includes a pair of fixed sidewalls 38 and a pair of removable sidewalls 39, it is understood that all of the sidewalls may be removable. Furthermore, any number of the fixed sidewalls 38 may be provided in combination with any number of the removable sidewalls 39, as long as removal of the removable sidewalls 39 defines a wafer removal opening 41 of sufficient width to facilitate removal of the wafers 42 from the wafer holder 32 along a generally horizontal plane.

While the preferred embodiments of the invention have been described above, it will be recognized and understood that various modifications can be made in the invention and the appended claims are intended to cover all such modifications which may fall within the spirit and scope of the invention.

What is claimed is:
1. A container for containing wafers, comprising:
   a wafer holder having a wafer support surface for supporting the wafers;
   a plurality of sidewalls carried by said wafer support surface, wherein at least one of said plurality of sidewalls is removable from said wafer support surface for removal of the wafers from said wafer holder along a generally horizontal axis;
   at least one sidewall groove provided in said wafer support surface and wherein said at least one of said plurality of sidewalls is removably inserted in said at least one sidewall groove, respectively; and
   an enclosure removably carried by said wafer holder for enclosing the wafers.
2. The container of claim 1 wherein said at least one of said plurality of sidewalls comprises at least two of said plurality of sidewalls removable from said wafer support surface.
3. The container of claim 1 wherein said wafer holder, said plurality of sidewalls and said enclosure are translucent.
4. The container of claim 1 further comprising a flexible pad carried by said plurality of sidewalls, respectively, for facing the wafers.
5. The container of claim 4 wherein said at least one of said plurality of sidewalls comprises at least two of said plurality of sidewalls removable from said wafer support surface.
6. The container of claim 4 wherein said wafer holder, said plurality of sidewalls and said enclosure are translucent.
7. The container of claim 1 further comprising at least one pair of sidewall flanges extending from said wafer support surface and wherein said at least one of said plurality of sidewalls is removably inserted between said at least one pair of sidewall flanges, respectively.
8. The container of claim 7 wherein said at least one of said plurality of sidewalls comprises at least two of said plurality of sidewalls removable from said wafer support surface, said at least one pair of sidewall flanges comprises at least two pairs of sidewall flanges, and wherein said at least two of said plurality of sidewalls is removably inserted between said at least two pairs of sidewall flanges, respectively.
9. The container of claim 7 further comprising a flexible pad carried by said plurality of sidewalls, respectively, for facing the wafers.
10. The container of claim 7 wherein said wafer holder, said plurality of sidewalls and said enclosure are translucent.
11. A container for containing wafers, comprising:
   a wafer holder having a wafer support surface for supporting the wafers;
   a pair of fixed sidewalls fixedly carried by said wafer support surface and defining a wafer removal opening having a width greater than a diameter of the wafers;
   a pair of removable sidewalls removably carried by said wafer support surface and normally closing said wafer removal opening for containing the wafers;
   a pair of sidewall grooves provided in said wafer support surface and wherein said pair of removable sidewalls is removably inserted in said pair of sidewall grooves, respectively; and
   an enclosure removably carried by said wafer holder for enclosing the wafers.

12. The container of claim 11 further comprising two pairs of adjacent sidewall flanges extending from said wafer support surface and wherein said pair of removable sidewalls is removably inserted between said two pairs of adjacent sidewall flanges, respectively.

13. The container of claim 11 further comprising a flexible pad carried by said pair of fixed sidewalls and said pair of removable sidewalls, respectively, for facing the wafers.

14. A container for containing wafers, comprising:
   a wafer holder having a base;
   a wafer support surface provided on said base for supporting the wafers;
   a pair of fixed sidewalls fixedly carried by said wafer support surface and defining a wafer removal opening having a width greater than a diameter of the wafers;
   a pair of removable sidewalls removably carried by said wafer support surface and normally closing said wafer removal opening for containing the wafers;
   a pair of sidewall grooves provided in said wafer support surface and wherein said pair of removable sidewalls is removably inserted in said pair of sidewall grooves, respectively; and
   an enclosure removably carried by said wafer holder for enclosing the wafers.

15. The container of claim 14 further comprising two pairs of adjacent sidewall flanges extending from said wafer support surface and wherein said pair of removable sidewalls is removably inserted between said two pairs of adjacent sidewall flanges, respectively.

16. The container of claim 14 further comprising a flexible pad carried by said pair of fixed sidewalls and said pair of removable sidewalls, respectively, for facing the wafers.

* * * * *